United States Patent [19]

Uzunoglu

[11] 4,274,067
[45] Jun. 16, 1981

[54] UNIVERSAL CLOCK RECOVERY NETWORK FOR QPSK MODEMS

[75] Inventor: Vasil Uzunoglu, Ellicot City, Md.

[73] Assignee: Communications Satellite Corporation, Washington, D.C.

[21] Appl. No.: 79,653

[22] Filed: Sep. 27, 1979

[51] Int. Cl.³ .................... H03K 3/282; H03L 7/24
[52] U.S. Cl. .................... 331/172; 331/108 B; 331/179
[58] Field of Search .............. 331/172, 173, 177 R, 331/179, 1 R, 10–12, 108 B, 137; 329/50; 307/269, 271; 328/63, 139; 375/97, 106, 110, 111

[56] References Cited

U.S. PATENT DOCUMENTS

| 3,792,361 | 2/1974 | Sordello et al. | 328/63 |
| 4,151,485 | 4/1979 | La Fratta | 331/11 X |

Primary Examiner—Siegfried H. Grimm
Attorney, Agent, or Firm—Sughrue, Rothwell, Mion, Zinn and Macpeak

[57] ABSTRACT

A clock recovery network uses a voltage proportional to the incoming symbol rate as a coarse tuning signal to control the tuned center frequency of a voltage controlled oscillator. The incoming data is used to positively synchronize the oscillator to the incoming data stream.

10 Claims, 6 Drawing Figures

UNIVERSAL CLOCK RECOVERY NETWORK FOR QPSK MODEMS

BACKGROUND OF THE INVENTION

In conventional modems, the clock recovery network has been designed to operate at high frequencies, e.g., above 10 MHz, or low frequencies. The high frequency clock recovery networks have proven quite acceptable but typically utilize delay elements. To operate these high frequency clock recovery circuits at lower frequencies requires that larger delay elements be utilized, and below approximately 10 MHz the required size of the delay element becomes unacceptable. For this reason, separate clock recovery networks have been designed for low frequency systems, these low frequency clock recovery networks typically incorporating phase lock loops with multiple control elements whose repeated adjustments become tedious and are often impractical.

In order to overcome this difficulty, I have invented a clock recovery network which is effectively useful at both low and high frequencies, and I have disclosed such a clock recovery network in my co-pending and concurrently filed application Ser. No. 79,654 entitled Clock Recovery For QPSK Modems and assigned to the same assignee as the present application. This co-pending application is incorporated herein by reference as if fully and completely repeated hereinbelow.

The present invention is an improvement in the clock recovery network disclosed in my co-pending application, and is directed to the use of such a clock recovery network in a universal modem. In present modems, the clock recovery network is designed to operate only at a single frequency, and in order to accomodate different bit rates, the clock recovery network must be replaced. Even in the clock recovery network disclosed in my co-pending application, the Synchronized Voltage Control Oscillator (SVCO) is tuned to a center frequency in the vicinity of the clock frequency to be recovered, and the incoming data stream is then used to positively synchronize the oscillator with the incoming data. If a different bit rate is to be employed, the oscillator would have to be replaced with a different oscillator tuned to a different center frequency. This requirement of replacing the clock recovery network in order to accomodate different bit rates can be quite troublesome in a universal modem which may be operated frequently at different bit rates.

SUMMARY OF THE INVENTION

It is an object of this invention to provide a clock recovery network which will accomodate a broad bit rate spectrum without the necessity of any replacement or readjustment of the network circuitry.

Briefly, this is achieved according to the present invention by utilizing voltage controlled resistors to determine the tuned center frequency of the oscillator, and by applying to these voltage controlled resistors a voltage proportional to the incoming bit rate. This voltage will serve as a coarse tuning signal to bring the frequency of the SVCO in the approximate frequency range at which it should operate, and the oscillator will then be synchronized to the incoming data by synchronizing pulses generated from the incoming data. The coarse tuning signal can be generated by a frequency-to-voltage (F/V) converter, and the voltage controlled resistors may comprise field effect transistors (FETs). In this way, a single clock recovery network can be used at both low and high frequencies and can accomodate a variety of incoming bit rates without the necessity of any readjustment or replacement of circuit components.

BRIEF DESCRIPTION OF THE DRAWINGS

The present invention will be more clearly understood with reference to the following description in conjunction with the accompanying drawings in which.

DETAILED DESCRIPTION OF THE INVENTION

Figure 1:
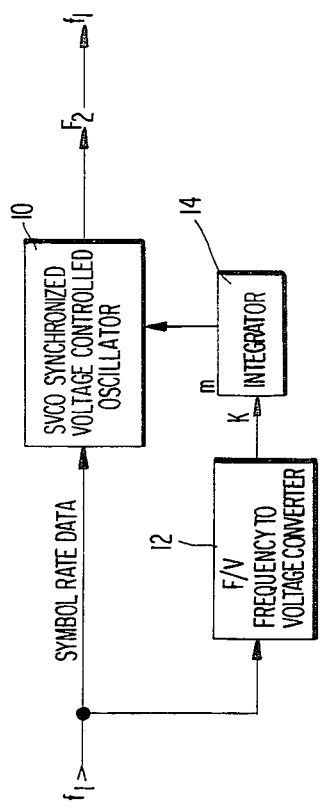
FIG. 1 is a block diagram of a universal clock recovery network according to the present invention.

FIG. 1 is a block diagram of the essential components of a universal clock recovery network according to the present invention. Recovered data, from P or Q channels with a repetition rate $f_1$, is applied simultaneously to the input of SVCO 10 and to the input of F/V 12. The F/V 12 generates a voltage proportional to the frequency of the externally applied signal and provides this through an integrator 14 to a coarse control input of the SVCO 10. This coarse control signal determines the approximate frequency range at which the oscillator 10 should operate, and the oscillator will then be entrained to the frequency $f_1$ by the incoming data in the manner described in my co-pending application. Due to nonlinearities in the F/V converter and the components in the oscillator 10, the voltage established by the converter 12 cannot bring the free-running frequency of the oscillator precisely to $f_1$. However, the output voltage of converter 12 must bring the oscillator 10 within the pull-in range of the external frequency $f_1$.

Figure 2:
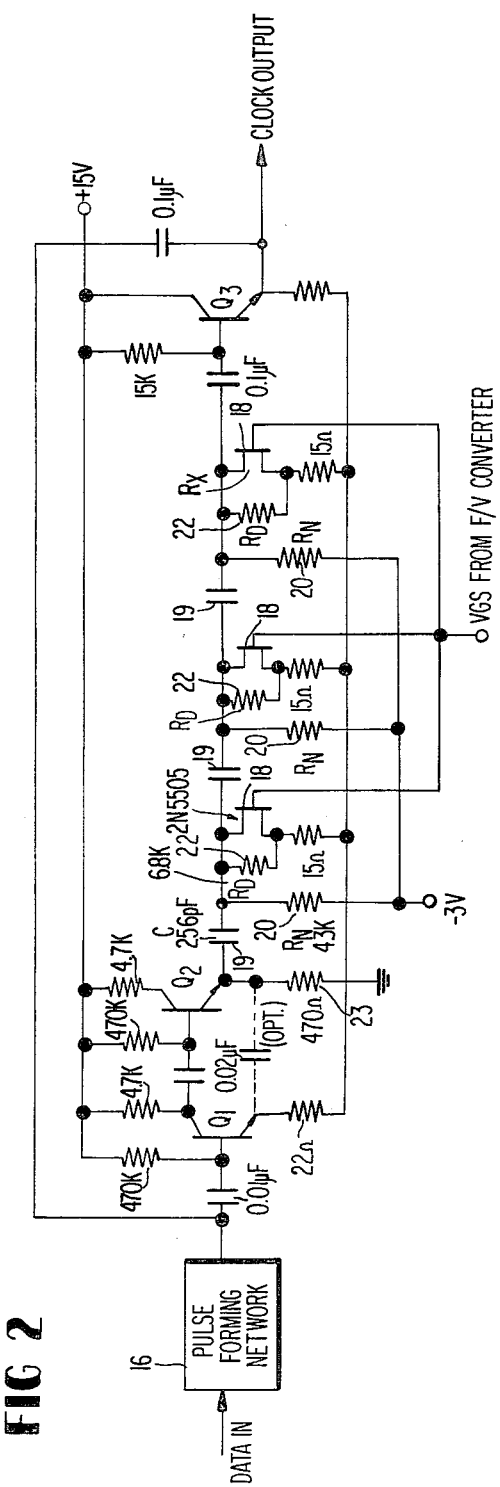
FIG. 2 is a schematic diagram of the synchronized voltage controlled oscillator illustrated in FIG. 1.

FIG. 2 is a schematic diagram of a SVCO circuit suitable for use in the clock recovery network according to the present invention. The oscillator illustrated in FIG. 2 is an RC phase-shift oscillator which, although it differs in structure from the oscillator circuitry disclosed in my co-pending application, utilizes the same principal of synchronization by means of the incoming data. The pulse forming network 16 shown in FIG. 2 may be identical to that disclosed in my co-pending application. The oscillator of FIG. 2 is less sensitive to pulse width and amplitude variations than the oscillators of my co-pending application and, therefore, no amplitude and pulse width determining circuit is necessary for proper operation. However, at higher frequencies it may be advisable to use such a circuit between the pulse forming network and the oscillator input. The recovered clock signal is fed back from the emitter of transistor $Q_3$ to the output of the pulse forming network where it is combined with the synchronizing pulses derived from the incoming data stream and supplied to the base of transistor $Q_1$ to control the oscillating frequency thereof.

To obtain the bit rate clock, the SVCO is tuned to twice the frequency of the symbol clock rate or, alternatively, the pulse forming network may incorporate a pulse doubling network in which case the SVCO is tuned to the symbol clock rate. The free-running frequency of the SVCO illustrated in FIG. 2, in the absence of any externally applied synchronizing pulses, is given by:

$$f_o = \frac{1}{2\pi \sqrt{6R_x C}} \quad (1)$$

where $R_x$ is the channel resistance of the field effect transistors 18, and C is the capacitance of the $R_x C$ phase-shift network determined primarily by capacitors 19. $R_x$ is determined by the control voltage applied to the gates of the field effect transistors 18, this control voltage being derived from the output of F/V converter 12 and being proportional to the input frequency $f_1$.

The integrator 14 in FIG. 1 is provided for the purpose of adding some memory to the SVCO so that the oscillator will continue to operate within the proper frequency range even in the presence of continuous 1's or 0's in the incoming data stream. This integrator may not be necessary in all cases, since some memory is already incorporated into the converter 12.

A buffer stage transistor $Q_3$ is added to the SVCO to linearize equation (1). Equation (1) indicates that the frequency versus $R_x$ varies asymptotically, and the non-linear nature of the curve is evident. Resistors 20 are added to the $R_x C$ phase-shift network so that the field-effect transistors have a d.c. return path, and a positive potential is applied to the resistors 20 so that the field-effect transistors are not forward biased due to the signal across resistor 23.

Figure 3:
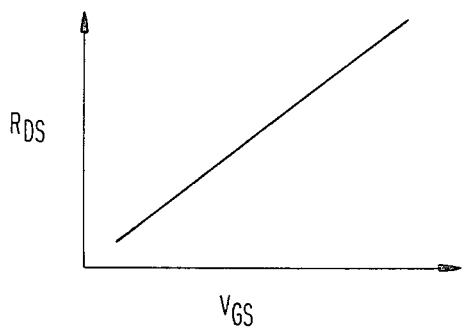
FIG. 3 is a graph of $R_{DS}$ versus $V_{GS}$ for the FETs illustrated in FIG. 2.

FIG. 3 generally illustrates the characteristics of $R_{DS}$ versus $V_{GS}$ of a JFET with $R_{DS}$ across the source and drain. The resistors 22 are added across the source and drain of the transistors 18 in order to linearize the $R_{DS}$ versus $V_{GS}$ characteristics.

Figure 4:
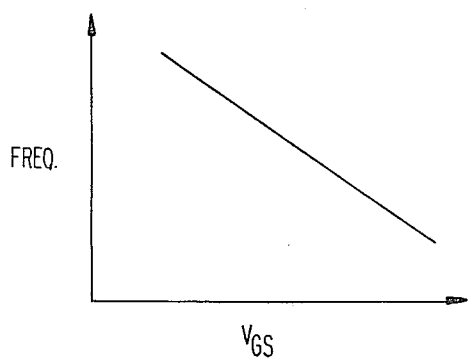
FIG. 4 is a graph of the tuned center frequency versus $V_{GS}$ for the voltage controlled oscillator of FIG. 2.
Figure 5:
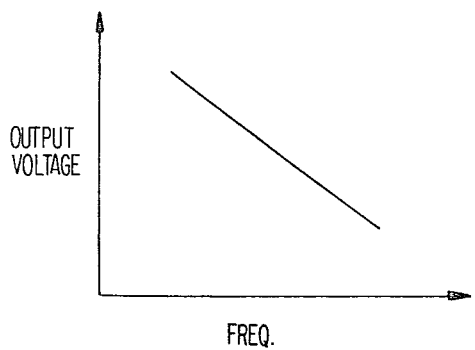
FIG. 5 is a graph of a typical input-output relationship for a frequency-to-voltage converter.

FIG. 4 generally illustrates the center frequency versus $V_{GS}$ for the oscillator circuit shown in FIG. 2. As $V_{GS}$ increases, the tuned center frequency decreases and, therefore, the F/V converter 12 must generate an output voltage which is inversely proportional to frequency. Thus, the output voltage versus input frequency characteristic of the F/V converter 12 must be as generally illustrated in FIG. 5. It should be noted that the linearity of FIG. 5 holds for sinusodial inputs, and that any other waveform will introduce some nonlinearity. However, this nonlinearity is of no great significance since the SVCO is only coarsely tuned by the output voltage of converter 12, and is actually synchronized by the external frequency $f_1$.

Figure 6:
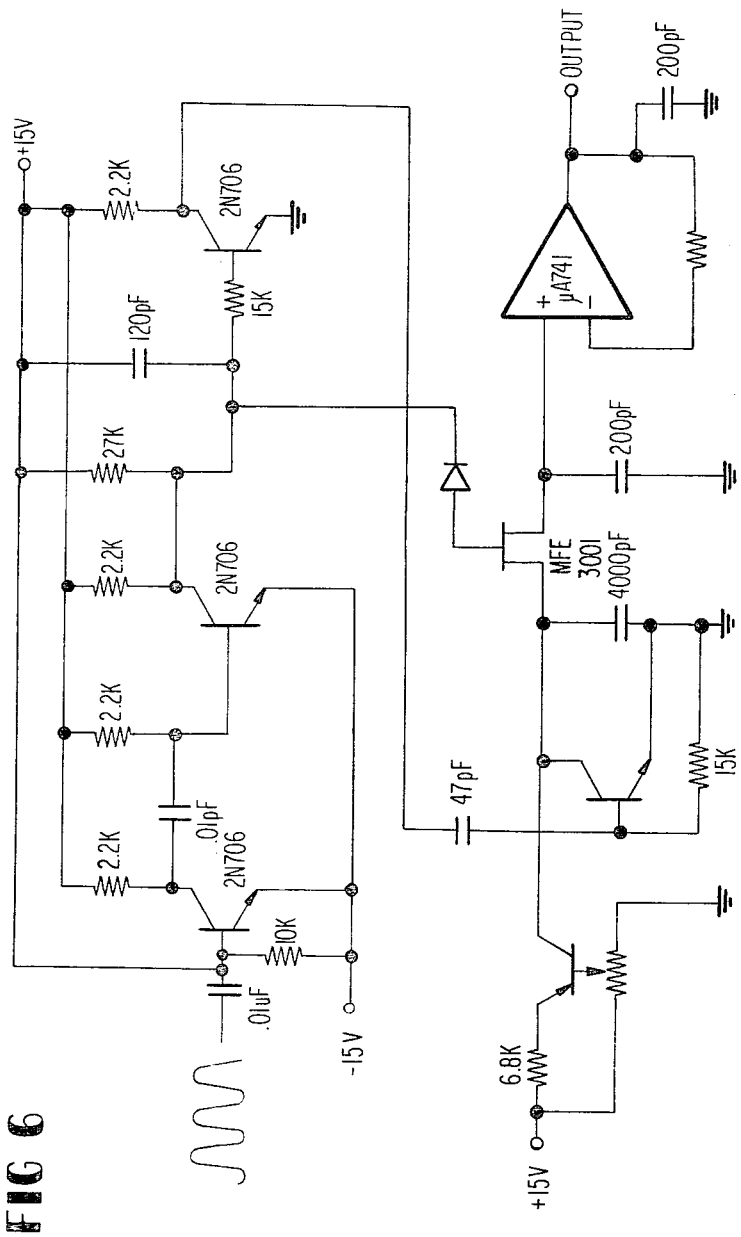
FIG. 6 is a schematic diagram of a conventional frequency-to-voltage (F/V) converter which may be used in the clock recovery network of FIG. 1.

A typical example of a F/V converter suitable for use in the present invention is shown in FIG. 6 and is described by Vasil Uzunoglu, "*Analysis Design of Digital Systems*", Gordon and Breach Book Company, 1974, page 106. Although a JFET was used in experiments, it is easily appreciated that this transistor could be readily replaced with a MOSFET.

It is apparent from equation (1) that the change in tuned center frequency of the oscillator is inversely proportional to $R_x$ which is the source-to-drain resistance of the JFET. A variation of approximately four octaves in $R_x$ is feasible in a JFET without any practical limitations, and this number may even go higher for MOSFETs.

The $R_x C$ components of the SVCO including the JFETs can be integrated on a single chip, whereas the transistors can be integrated on a second chip. The F/V converters are already available as integrated elements. Thus, the entire structure can be realized as high bit element consisting of 3 to 4 chips. It is apparent that the present invention will simplify the operation of a universal modem, as well as reduce its cost and size by effectively accomodating a variety of incoming bit rates. With the universal clock recovery network according to the present invention, it is possible to build universal modems which can operate in a bit rate range of several octaves without replacing the clock recovery network, nor are there any mechanical adjustments required.

What is claimed is:

1. A clock recovery network for receiving an input data stream having a symbol clock rate and providing as an output a clock signal synchronized with said input data stream, said network comprising:
   oscillator means for receiving said input data stream and providing at its output a clock signal synchronized with said input data stream, said oscillator means being synchronized to said input data stream by means of synchronizing pulses generated from said input data stream, the free-running frequency of said oscillator means in the absence of said synchronizing pulses being determined by a coarse control voltage; and
   coarse control voltage generating means for generating and providing to said oscillator means a coarse control voltage corresponding to a desired output frequency of said clock recovery network.

2. A clock recovery network as defined in claim 1, wherein said oscillator is a synchronized voltage controlled oscillator for receiving a synchronization signal and providing a digital output clock synchronized to said synchronization signal.

3. A clock recovery network as defined in claim 2, wherein said oscillator means includes a pulse forming network for receiving said input data stream and generating therefrom a stream of synchronization pulses.

4. A clock recovery network as defined in claim 3, wherein the output of said oscillator means is fed back and combined with the output of said pulse forming network.

5. A clock recovery network as defined in claim 1, wherein said coarse control voltage corresponds to approximately twice the frequency of said symbol clock rate.

6. A clock recovery network as defined in claim 1, wherein said oscillator means includes at least one variable resistance element the resistance of which determines the free-running frequency of said oscillator means.

7. A clock recovery network as defined in claim 6, wherein said at least one variable resistance element comprises a plurality of variable resistance elements connected in parallel.

8. A clock recovery network as defined in claims 6 or 7, wherein said at least one variable resistance element comprises a field effect transistor.

9. A clock recovery network as defined in claim 1, wherein said coarse control voltage generating means comprises a frequency-to-voltage converter for receiving an input signal and providing a coarse control voltage corresponding to the frequency of said input signal, said frequency-to-voltage converter receiving said input data stream as its input signal.

10. A clock recovery network as defined in claim 9, further comprising integrator means coupled between said frequency-to-voltage converter and said oscillator means, whereby said oscillator means will continue to operate at said desired output frequency even during the absence of an output from said frequency-to-voltage converter.

* * * * *

UNITED STATES PATENT AND TRADEMARK OFFICE
CERTIFICATE OF CORRECTION

PATENT NO. : 4,274,067
DATED : June 16, 1981
INVENTOR(S) : Vasil Uzunoglu

It is certified that error appears in the above—identified patent and that said Letters Patent is hereby corrected as shown below:

Column 1, line 35 - Delete "accomodate" insert --accommodate--;

line 46 - Delete "accomodate" insert --accommodate--;

line 53 - Delete "accomodate" insert --accommodate--.

Column 2, line 2/3 - Delete "accomodate" insert --accommodate--.

Column 4, line 11 - Delete "accomodating" insert --accommodating--.

Signed and Sealed this

Twenty-fifth Day of August 1981

[SEAL]

Attest:

Attesting Officer

GERALD J. MOSSINGHOFF
Commissioner of Patents and Trademarks